United States Patent
Turner et al.

(10) Patent No.: US 11,312,648 B2
(45) Date of Patent: Apr. 26, 2022

(54) CONTROL SYSTEM FOR FURNACE

(71) Applicant: LAND INSTRUMENTS INTERNATIONAL LIMITED, Leicester (GB)

(72) Inventors: Susan Fiona Turner, Derbyshire (GB); Neil George Simpson, Ayton (GB); Mark Ashton Bennett, Derbyshire (GB); Peter Drögmöller, Derbyshire (GB)

(73) Assignee: LAND INSTRUMENTS INTERNATIONAL LIMITED, Leicester (GB)

( * ) Notice: Subject to any disclaimer, the term of this patent is extended or adjusted under 35 U.S.C. 154(b) by 331 days.

(21) Appl. No.: 16/467,533

(22) PCT Filed: Sep. 21, 2017

(86) PCT No.: PCT/GB2017/052830
§ 371 (c)(1),
(2) Date: Jun. 7, 2019

(87) PCT Pub. No.: WO2018/104695
PCT Pub. Date: Jun. 14, 2018

(65) Prior Publication Data
US 2019/0322562 A1 Oct. 24, 2019

(30) Foreign Application Priority Data

Dec. 8, 2016 (GB) .................................. 1620863

(51) Int. Cl.
*F27D 21/02* (2006.01)
*G01J 5/00* (2022.01)
(Continued)

(52) U.S. Cl.
CPC ................. *C03B 5/24* (2013.01); *C03B 5/04* (2013.01); *C23C 16/44* (2013.01); *F27D 19/00* (2013.01);
(Continued)

(58) Field of Classification Search
CPC .. C03B 5/04; C03B 5/24; G01J 5/0044; G01J 2005/0077; F27D 21/0014; F27D 19/00;
(Continued)

(56) References Cited

U.S. PATENT DOCUMENTS 5,890,444 A * 4/1999 Martin .................... F23N 5/082
110/346
7,348,562 B2 * 3/2008 Irani ..................... G01J 5/0044
250/339.02
(Continued)

FOREIGN PATENT DOCUMENTS

CN 104215334 A 12/2014
EP 1 655 570 A1 5/2006
(Continued)

OTHER PUBLICATIONS

Aug. 31, 2021—(JP) Notification of Reasons for Refusal—App 2019-528926.
(Continued)

*Primary Examiner* — Gregory A Wilson
(74) *Attorney, Agent, or Firm* — Banner & Witcoff, Ltd.

(57) ABSTRACT

There is provided a control system for a furnace. The control system comprises a thermal imaging camera and a control unit. The thermal imaging camera is configured to receive thermal radiation from a plurality of positions in a furnace and to generate an image which includes temperature information for the plurality of positions in the furnace. The control unit is configured to receive the image from the thermal imaging camera and to generate control signals for the furnace using the image.

32 Claims, 3 Drawing Sheets

(51) Int. Cl.
    *C03B 5/24* (2006.01)
    *C03B 5/04* (2006.01)
    *C23C 16/44* (2006.01)
    *F27D 19/00* (2006.01)
    *F27D 21/00* (2006.01)
    *G01F 23/24* (2006.01)

(52) U.S. Cl.
    CPC ......... *F27D 21/0014* (2013.01); *F27D 21/02* (2013.01); *G01F 23/246* (2013.01); *G01J 5/0018* (2013.01); *G01J 5/0044* (2013.01); *F23N 2229/20* (2020.01); *G01J 2005/0077* (2013.01)

(58) Field of Classification Search
    CPC ... F27D 21/02; F27D 2021/026; G01F 23/246
    See application file for complete search history.

(56) References Cited

U.S. PATENT DOCUMENTS

| | | | |
|---|---|---|---|
| 10,274,375 B2* | 4/2019 | Dubbs | G01J 5/089 |
| 2002/0124598 A1* | 9/2002 | Borysowicz | C03B 5/24 |
| | | | 65/158 |
| 2003/0123518 A1 | 7/2003 | Abbasi et al. | |
| 2010/0111511 A1* | 5/2010 | Merry | H01L 21/67115 |
| | | | 392/411 |
| 2013/0248504 A1* | 9/2013 | Kusuda | B23K 26/352 |
| | | | 219/121.85 |
| 2015/0289324 A1* | 10/2015 | Rober | H05B 6/68 |
| | | | 219/711 |
| 2016/0097680 A1* | 4/2016 | Bietto | G01J 5/0018 |
| | | | 356/43 |

FOREIGN PATENT DOCUMENTS

| | | | |
|---|---|---|---|
| GB | 1175567 A | 12/1969 | |
| JP | S5822313 A | 2/1983 | |
| JP | H06-123656 A | 5/1994 | |
| JP | 2003-121262 A | 4/2003 | |
| JP | 2004-219114 A | 8/2004 | |
| JP | 2013-544735 A | 12/2013 | |
| WO | 2007/091793 A1 | 8/2007 | |

OTHER PUBLICATIONS

Dec. 11, 2017—PCT/GB2017/052830—ISR & WO.
May 23, 2017—GB 1620863.9—Search Report.

* cited by examiner

CONTROL SYSTEM FOR FURNACE

CROSS-REFERENCE TO RELATED APPLICATIONS

This application is a U.S. National Stage application under 35 U.S.C. § 371 of International Application PCT/GB2017/052830 (published as WO 2018/104695 A1), filed Sep. 21, 2017, which claims the benefit of priority to Application GB 1620863.9, filed Dec. 8, 2016. Benefit of the filing date of each of these prior applications is hereby claimed. Each of these prior applications is hereby incorporated by reference in its entirety.

The present invention relates to a control system for a furnace using a thermal imaging camera. In particular, the invention relates to techniques for improving the product produced by the furnace and the energy usage, operational efficiency and lifetime of that furnace.

Glass is manufactured industrially by adding raw material in a granular state, typically referred to as 'batch', to one end of a 'melt tank' or furnace. Burners are provided above the batch in order to melt it, and the end product flows out of the other end of the furnace. Furnaces are also used in the industrial production of other products such as metals.

Burners are typically located in the ends or sides of a furnace, to produced so-called end-fired or side-fired designs both air and oxy fired. There is often a symmetrical or staggered arrangement of burners along both ends/sides of the furnace. In regenerative air furnaces the burners at either end/side are fired sequentially with a 'reversal' approximately every twenty to thirty minutes.

Furnaces have traditionally had thermocouples or other discrete temperature measurement devices to measure single point temperatures. High temperature and aggressive environment furnaces typically have thermocouples which are embedded in refractory walls and give indications of temperature trends. Instantaneous point measurements within the furnace can also be determined using a hand-held pyrometer or fixed fibre temperature device. These can determine temperature measurements for a single position in the furnace but can only be read infrequently, when access windows can be opened, or when there is no flame present during a reversal.

Furnace emission measurements are typically performed in the exhaust stack or chimney. While continuous measurement is possible, the measurements suffer from a significant time lag due to the large volume of the furnace and limited gas flow rates in and out of the furnace.

Thermal and optical imaging cameras have recently been introduced for monitoring temperature conditions inside furnaces in real-time. Thermal imaging cameras can produce heatmaps for the conditions within the furnace using infrared radiation.

It has been found that the temperature profile in a furnace is important for product quality, energy usage and operational efficiency. For glass the temperature should ideally rise to a maximum at a specific point along the length of the furnace, before falling off again towards the discharge end. This establishes convection currents within the glass so that they rise at the point of maximum temperature, but batch typically melts into the glass at the charging/melting end of the furnace. 'Bubbling' or electrodes or weir wall or change in depth is sometimes seen at the point of maximum temperature where hot glass from the depths rises to the surface. Deviation of the hotspot or batch melting positions indicate loss of product quality.

Temperature profile of the walls and crown of the furnace is also important. Thermal stress leads to refractory damage around hot or cold spots. Corrosive compounds such as NaOH can condense in cold areas of the furnace, so cold spots also suffer chemical attack. This is a particular problem in furnaces using modern oxy-fuels with high flame temperatures which can produce up to 3.5 times the percentage level of NaOH from air-fuel mixtures.

Detailed thermal images can also be used to identify areas where thermally dependent chemical reactions may be occurring. For instance, the majority of the $NO_x$ produced in glass melting applications is 'thermal $NO_x$' formed at temperatures in excess of 1600° C. (2900° F.), with rate of production increasing as temperature increases further. When images from the thermal imaging camera are compared with flue gas measurements from a portable combustion gas analyser, it is evident that the port or side of the furnace with apparent larger areas of temperature above 1600° C. has the higher $NO_x$. Based on the theory of thermal $NO_x$, the higher the temperature of the flame the higher the rate of production of $NO_x$. The larger the area of high temperature, the larger the reaction zone. Thus real-time thermal images of the furnace allow rapid identification of regions where thermally sensitive chemical reactions may be occurring, and the temperature of those regions can provide an indication of potential reaction rate.

A problem exists in conventional furnaces because it can take undesirably long to respond or react to changes in operation. An object of the present invention is to address and mitigate this problem.

According to an aspect of the invention there is provided a control system for a furnace, comprising: a thermal imaging camera configured to receive thermal radiation from a plurality of positions in a furnace and to generate an image which includes temperature information for the plurality of positions in the furnace; and a control unit configured to receive the image from the thermal imaging camera and to generate control signals for the furnace using the image.

According to another aspect of the invention there is provided a computer program product comprising computer executable instructions which, when executed by a computer, cause the computer to carry out steps including: receiving thermal radiation at a thermal imaging camera from a plurality of positions in a furnace; generating an image which includes temperature information for the plurality of positions in the furnace; and generating control signals for the furnace at a control unit using the image.

The thermal imaging camera is preferably arranged to generate a wide-angle image of the inside of the furnace, including temperature information for hundreds or thousands of positions, corresponding to pixels within the camera. Preferably, the thermal imaging camera is configured to image a plurality of regions of the furnace. This may include any of product, walls and crown of the furnace. The control signals may be for differentially adjusting the temperature at multiple positions within the furnace.

The thermal imaging camera can determine the temperature profile in the furnace in real-time. The control signals may, therefore, adjust the properties of the furnace in real-time. This real-time feedback control can ensure high quality product at all times, minimising waste of product and energy. A number of other terms are used in the art to refer to a thermal imaging camera, such as "infra-red camera" and "thermal imaging borescope".

The thermal imaging camera and control signals may be used during any of heat-up, during cool-down and/or during repair operations (such as ceramic welding of the refractory walls), as well as during continuous operation of the furnace.

A plurality of thermal imaging cameras may be used with the furnace in order to provide redundancy in the case of malfunction or to provide viewing angles for different aspects of the furnace. In one instance, a thermal imaging camera with a lower temperature range may be used during furnace heat-up when the furnace is particularly vulnerable to damage due to differential expansion rates. In another instance, a thermal imaging camera that is sensitive to a particular range of wavelengths may be chosen to either image or 'see through' constituents of the furnace atmosphere or to image from deeper within the molten product.

Preferably the control unit comprises a reflection compensation module configured to identify and subtract a reflected component in the radiation received from a position in the furnace. A molten or partially molten product on the base of a furnace may act as an effective reflector of thermal radiation. By subtracting the reflected component it may be possible to determine a radiated component, emitted directly from the product. In this way, it may be possible to determine an accurate emissivity and temperature for the product. A plurality of positions of the product may be selected. Emissivity and temperature calculation may be performed for each position. Alternatively the emissivity value calculated at one position may be used to calculate temperature at other positions where the product is at the same stage in the process and likely to have the same emissivity.

The reflection compensation module may optionally select two positions on a product in the furnace, wherein the two selected positions are at substantially the same temperature. The two selected positions may include reflected components emanating from respective positions in the furnace which are at different temperatures. Thus, the reflected components can be identified because a different amount of radiation would be received from the two selected positions, despite the fact that they are at substantially the same temperature. This can allow identification and subtraction of the reflected component, to determine the true temperature of the product at the two selected positions. This may be achieved by calculating the emissivity of the product, which may be glass.

Preferably the thermal imaging camera also receives thermal radiation radiated directly from the respective positions in the furnace which are at different temperatures. This can allow the reflection compensation module to subtract this radiated flux from the radiation received from the selected positions on the product.

An additional temperature sensing device may be provided for receiving radiation from a single position in the furnace and determining a temperature for that position. The control unit may then compare the temperature determined for the relevant position by the temperature sensing device and the thermal imaging camera, and calibrate the temperature information associated with the image generated by the thermal imaging camera. Thus, an adjustment can be applied to the temperature calculated by the thermal imaging camera. This may be particularly helpful where material has obscured the camera lens and has reduced the amount of radiation received, leading to erroneous temperature measurements. Such a situation is not unusual in the inclement environment of a furnace.

In one arrangement the temperature sensing device is a pyrometer which is designed to determine a temperature at a single position. The temperature sensing device may be mounted in a different position to the thermal imaging camera to minimise the likelihood that both devices experience the same kind of obscuration.

The temperature sensing device may be configured to receive radiation at (at least) two wavelengths, and to determine a temperature for the relevant position based on the relative amount of radiation received at the two wavelengths. A dual wavelength pyrometer can measure temperature correctly despite partial obscuration because the effect of any obscuration on temperature is different at the different wavelengths. The dual wavelength pyrometer can be used to effectively calibrate the temperature measurement of the relevant position within the thermal image, and the factor required compensate for obscuration at that point can also be applied to the rest of the thermal image. In certain embodiments the thermal imaging camera may be capable of receiving radiation in more than one wavelength, which means that the thermal imaging camera may be able to self-calibrate, without the need for a further temperature sensing device, such as a pyrometer.

The control unit may be configured to compare the image to a previously collected image to detect a change in temperature or position. The images may be generated at successive points in time and the images compared to previous images by the control system to determine any of movement, speed, temperature changes and rates of change. Advantageously, this enables a history of conditions experienced by the product during formation to be compiled for quality purposes. It enables anomalous rates of change and slow degradation of materials or instrumentation such as thermocouples to be identified. Images from successive points in time may be used to log conditions or identify anomalous temperature changes during continual operation, during furnace heat-up or cool-down, or during maintenance operations.

The successive points in time may be at any interval from the interval between successive frames up to an interval of a year. Regular measurements could be taken at fixed time intervals or according to furnace events. For instance, for a regenerative glass furnace it would be possible to record the temperature image at the first two reversals after midnight each day. In some aspects over 300,000 temperature data points may be collected at each successive point in time.

The use of a thermal imaging camera means that a furnace can be monitored over long periods. Thus, the control unit may be configured to generate control signals that change operation of the furnace over long time periods. The use of these control signals may prolong the life of the furnace or may be used to provide better timing of maintenance.

According to yet another aspect of the invention there is provided a method of controlling a furnace, the method comprising the steps of: receiving thermal radiation at a thermal imaging camera from a plurality of positions in a furnace; generating an image which includes temperature information for the plurality of positions in the furnace and generating control signals for the furnace at a control unit using the image. The method may further comprise the step of controlling the furnace according to the control signals generated at the control unit.

In this way, the furnace can be controlled according to the temperature at the plurality of positions. Adjustments can be made to furnace properties such as the burners, and/or rate of throughput. This may improve the quality of the end product and production rate, maximise the lifetime of the furnace and minimise energy usage and emissions.

Preferably the control signals are for adjusting the temperature in the furnace. The temperature in the furnace may be adjusted by controlling flame length, and/or the fuel/ oxygen or air mixture. The flames may also be controlled to achieve fine control in the temperature at different positions in the furnace. Precise control of the temperature profile may be important to optimise the quality of the product as well as energy usage, operational efficiency and lifetime of that furnace.

In some embodiments, the control unit is further configured to identify positions where the temperature exceeds (high or low) a predetermined value. This may indicate a state where infrastructure damage or product quality loss may occur. The control signal may be used to supply more or less heating as required.

The control signals may be used to control reversal of burners. The reversal of burners may therefore occur at the most appropriate time according to the real-time state of the furnace, rather than simply at regular time intervals. The reversal of burners may be signalled by the control unit when the thermal imaging camera indicates that the temperature at a particular position or plurality of positions has reached a predetermined value or a maximum value, or where the proportion of positions above that predetermined value has reached a predetermined threshold. The particular position may relate to any area or multiple areas of the image to trigger reversal based on wall, crown, product and/or flame temperatures.

The control signals may be for adjusting the introduction rate of raw product, typically referred to as 'batch'. Real-time control of the throughput of product has been found to be important in optimising product quality, energy usage and operational efficiency. In some aspects the method may further comprise identifying regions of batch in the image and tracking the movement of the batch based on the temperature information.

The control unit may comprise a batch identification module configured to identify batch in the image from the thermal imaging camera. In this way, a temperature can be determined for the batch. The batch identification module may identify positions in the image where there is batch and to avoid using data from these positions in the generation of control signals relating to molten glass temperature.

Preferably, the batch identification module may be configured to determine the speed of the identified batch. The thermal imaging camera may generate images at successive points in time, such that the temperature information obtained at the successive points in time can be integrated to track the movement of the batch. This can be used to determine its speed.

Tracking the movement of the batch may involve predicting the movement of the batch. The prediction of batch movement may be based on temperature information at a plurality of positions. The control signals can be used for adjusting the temperature at one or more positions in the furnace to control the movement of the batch. Alternatively or in addition, they may be used for controlling the introduction of the batch.

From analysis of the product temperature distribution, convection currents can be identified as paths from hotter to cooler regions. These convection currents define the real time movement of the batch. This may be used to control the batch charger, as mentioned above, to direct the batch into the optimum convective current to maximise mixing, residence time and thereby product quality. Alternatively, the control unit may adjust or switch between burners to change the convective flow pattern and direct batch movement.

Identifying and controlling convective currents may be useful in reducing damage as well as determining properties of the product. Due to the Marangoni effect, there is continuous wear of the glass contact refractory of the glass bath of the furnace. It has also been found that regions of excessive cooling can cause increased wear. Being able to track the movement of the batch and control the convective flow can help reduce this unwanted effect.

According to another aspect of the invention there is provided a furnace for receiving and melting batch to form a product, the furnace comprising: a chamber; a batch dispenser or charger for introducing batch to the chamber; at least one burner for melting batch introduced to the chamber; and the control system as defined above.

The furnace may be specifically designed for the production of glass or it may be suitable for other products such as metals.

Preferably the furnace comprises a first burner or arrangement of burners along a first side of the chamber and a second burner or arrangement of burners along the second side of the burner. The control signals can preferably switch between operation of the first side and second side of burners, based on the image received from the thermal imaging camera. In this way, the reversal of the furnace can be controlled dynamically according to real-time thermal conditions.

The control unit may switch between operation of the first and second side burners when the temperature at a position in the furnace reaches a predetermined value, or a maximum value. The position may be a predetermined position. The predetermined position may be any region of the furnace or regenerator. The detection of this condition may prompt the reversal of the furnace to ensure any of optimum quality of product, energy usage, emissions and asset lifetime.

In some instances, the control signals can further switch and control the fuel profile to individual burners. This may be within an extended set of burners. In this way finer adjustments to the temperature profile within the furnace is possible.

In some aspects, the reversal or individual adjustment of the burner controls may be to control the movement of the batch within the furnace in real time. For instance, when a cool region is detected the burner closest to the cold region may be switched on to ensure the batch moves away from the cool region.

The method may further comprise identifying positions or the number or proportion of positions within a region where the temperature exceeds a predetermined value. Many chemical reactions are thermally sensitive (dependent) so their potential reaction volume can be observed within a thermal image. The chemical reaction may involve the formation of desirable compounds or the formation of unwanted by-products such as $NO_x$.

In one instance, positions with temperatures above a predetermined value of at least 1600° C., and typically above 1800° C., may be used as a real-time indicator of $NO_x$ formation rate. In this case the control signals may be used to switch between the first and second side burners, or reduce the temperature or length of the flame from one or more individual burners by adjustment of the fuel profile or velocity to that burner.

According to a further aspect there is provided a control system for a furnace, comprising: a thermal imaging camera configured to receive thermal radiation from a plurality of positions in a furnace, to generate images which includes temperature information for the plurality of positions in the furnace; a control unit configured to analyse the temperature information to determine positions exhibiting anomalous temperature and generate control signals to cause an alarm to indicate that the anomalous temperature has been detected.

In a yet further aspect there is provided a computer program product comprising computer executable instructions which, when executed by a computer, cause the computer to carry out steps including: receiving thermal radiation at a thermal imaging camera from a plurality of positions in a furnace; generating an image which includes temperature information for the plurality of positions in the furnace; analysing the temperature information to determine positions exhibiting anomalous temperature; and generating control signals to cause an alarm to indicate that the anomalous temperature has been detected.

Advantageously, this enables detection of regions which are operating at a temperature outside of the range typically desired. This can enable the operator to take appropriate action. The anomalous temperature in some aspects may indicate product quality concerns and in others may indicate damage or the potential of damage to the furnace. Appropriate actions may include any of adjustment to the furnace operating conditions (such as burner settings), sending the current product for quarantine and quality inspection at a subsequent stage, and furnace maintenance activities. The alarm system may be used during continual operation, during furnace heat-up or cool-down, or during repair work.

The alarm may be any of a low temperature alarm, a high temperature alarm, or a temperature alarm to indicate that the temperature is either within or not within predetermined ranges. Alarms may be triggered by comparing the temperature at a position to predetermined maximum, minimum or ranges of threshold values. Alarms may also be triggered by temperature differences between positions within the image, or by temperature differences between positions in the image and alternative sources of temperature measurement such as thermocouples. There may be different alarms to indicate different temperature regimes detected.

Embodiments of the invention are now described, by way of example, with reference to the drawings, in which.

Figure 1:
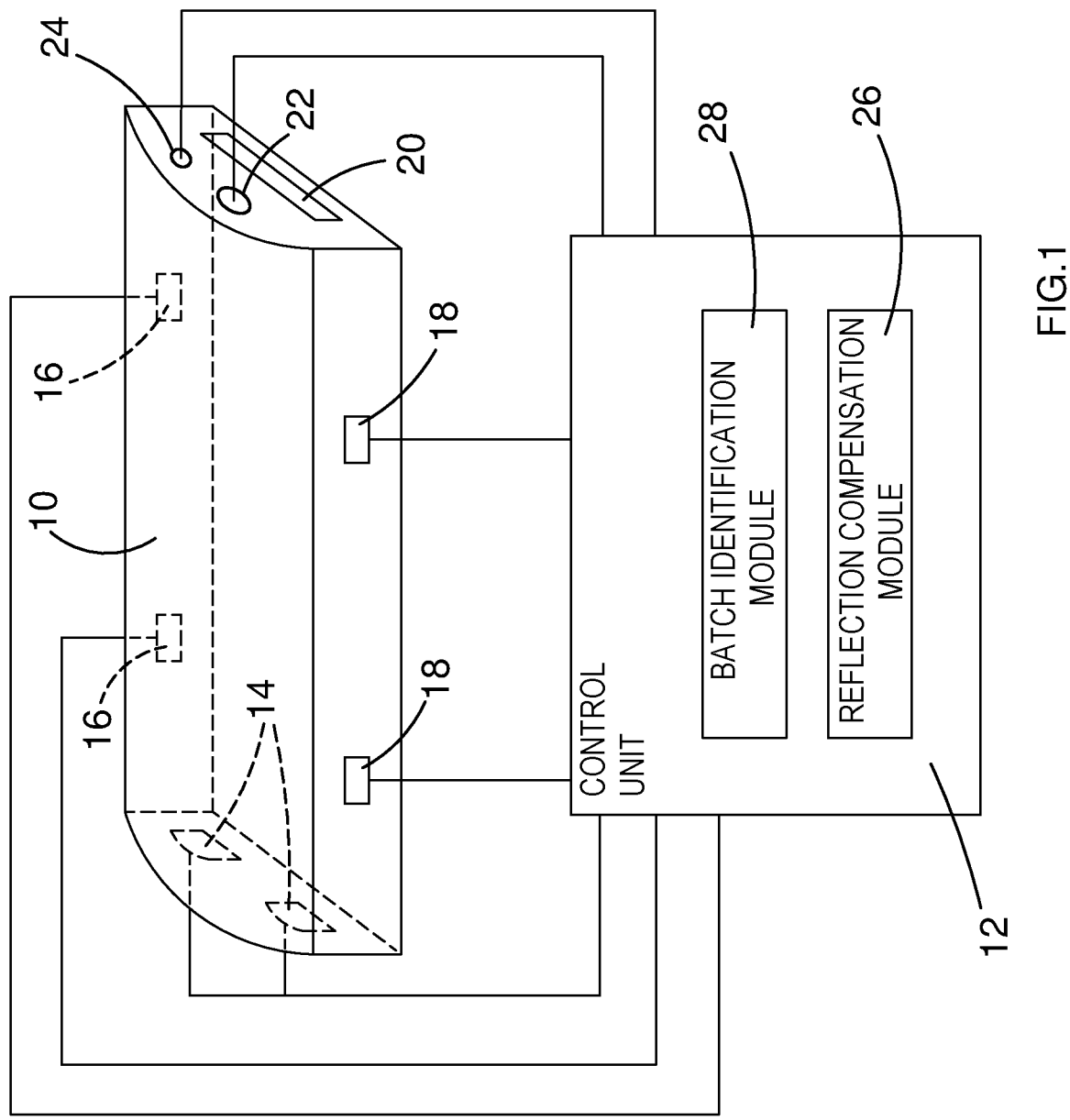
FIG. 1 is a schematic view of a furnace and a control system in an embodiment of the present invention.

FIG. 1 is a schematic view of a furnace 10 and a control unit 12. The furnace 10 includes batch chargers 14 for charging or dispensing batch, or raw product, at one end of the furnace. Side burners 16, 18 are provided on both sides of the furnace 10. The side burners 16 on one side of the furnace 10 are designed to be fired for around twenty minutes, after which there is a reversal and the side burners 18 on the other side are fired. A product outlet 20 is provided at the opposite end of the furnace 10 to the batch chargers 14. In use, batch is introduced by the batch chargers and is melted by the side burners 16, 18. The side burners 16, 18 are controlled to create a desired temperature profile in the furnace 10 which typically reaches peak temperature 75-80% of the way along a container furnace. Other furnaces for higher quality glass will have peak temperature closer to the chargers 14. The temperature profile then decreases from its maximum towards the product outlet 20.

Figure 2:
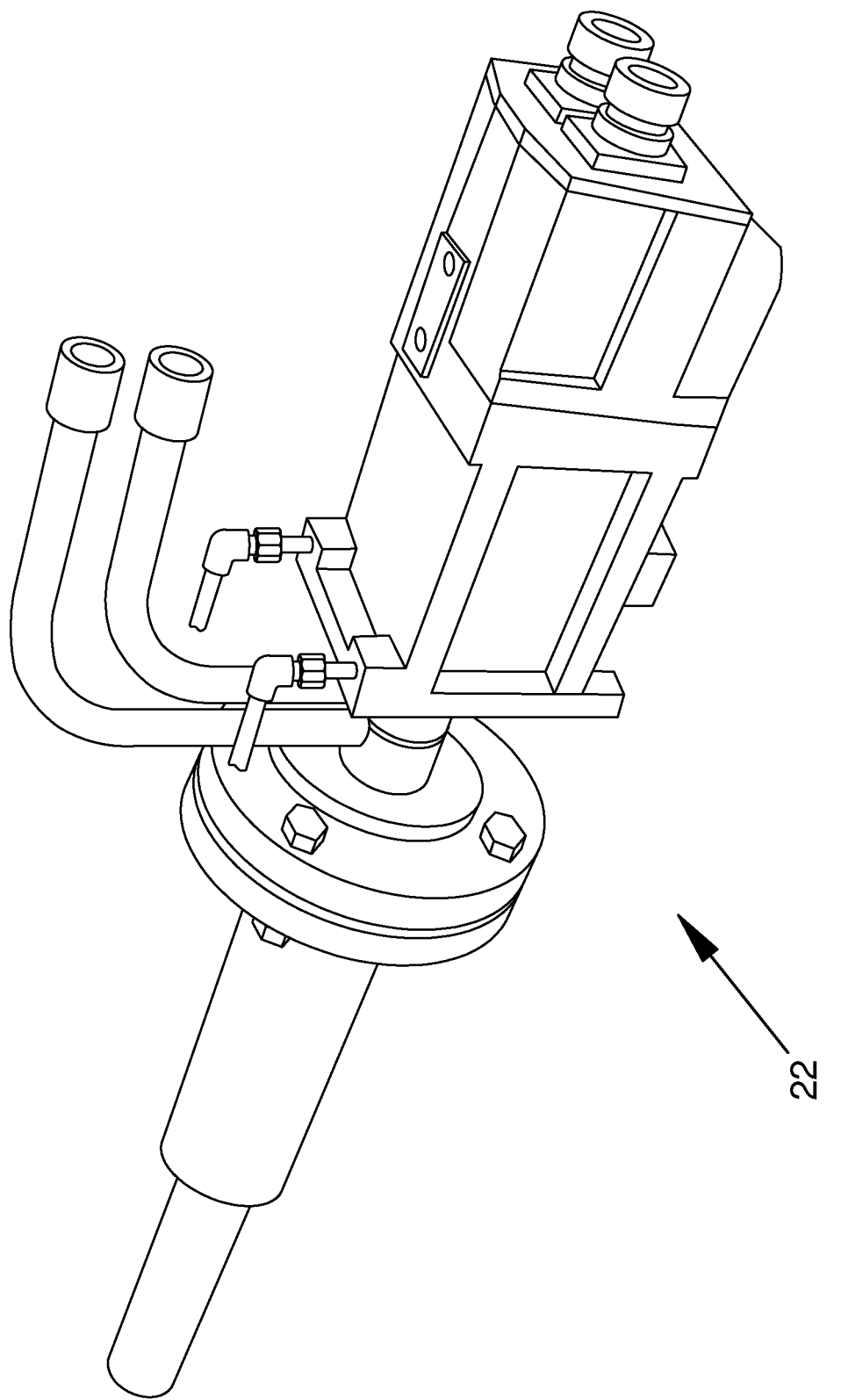
FIG. 2 is a perspective view of a thermal imaging camera for use in an embodiment of the present invention.

The furnace 10 includes a thermal imaging camera 22 situated in an end wall, opposite the batch chargers 14. An example thermal imaging camera 22 is shown in FIG. 2. This camera is known commercially as the NIR Borescope, produced by Land Instruments International Ltd. The thermal imaging camera 22 is designed to produce a high resolution image of the inside of the furnace 10, with more than 300,000 pixels and a 90° field of view. The high resolution image produced by the thermal imaging camera includes temperature information for each pixel, corresponding to individual positions within the furnace 10.

In the embodiment of FIG. 1 there is a single camera with a longitudinal view back to the chargers 14 in order to monitor the batch line. In other embodiments the camera may be installed on other walls or within the furnace crown, or multiple cameras may be used. Field of view may not always be 90° and the instrument may not necessarily be aligned perpendicular to its mounting. In some embodiments, the thermal imaging camera may be movable. The arrangement of thermal imaging cameras can be such that the temperature can be measured throughout the furnace as required.

The furnace 10 also includes a dual wavelength pyrometer 24 which is also situated in the end wall, opposite the batch chargers 14, but offset from the thermal imaging camera 22. The dual wavelength pyrometer 24 is arranged to point at a specific position in the furnace 10, which may be the product on the base of the furnace 10, or one of the walls. The dual wavelength pyrometer 24 can be used to determine temperature in the furnace by analysing the ratio of radiation received at the two wavelengths. The temperature determined by the dual wavelength pyrometer 24 is, therefore, largely unaffected by any obscuration which may develop on the device.

The batch chargers 14, side burners 16, 18, thermal imaging camera 22 and dual wavelength pyrometer 24 are connected to the control unit 12. In use, the thermal imaging camera 22 generates a real-time high resolution thermal image of the inside of the furnace 10, including temperature information for each point in the image, and sends this to the control unit 12. The control unit 12 processes the image using one or more processors by comparing it to an ideal temperature profile. The control unit 12 determines differences between the actual temperature profiles in the furnace 10 detected by the thermal imaging camera 22 and the ideal temperature profile and generates control signals for the furnace 10. The control signals can be sent to the side burners 16, 18 in order to alter conditions in the furnace 10 and to reduce differences between the actual temperature profile and the ideal temperature profile.

An iterative real-time process is undertaken until the actual temperature profile is a close match to the ideal temperature profile.

The control unit 12 is shown separately from the thermal imaging camera 22. In some embodiments the control unit 12 may be embedded within the thermal imaging camera 22. The control unit 12 may be implemented in a computer or any other local or remote computing device. The control unit 12 can be used to log thermal images and compare those images with previous images to deduce movement, speed, temperature changes and rate of change. The control unit 12 generates the signals to control the furnace and alarms to warn personnel of potential problems.

The dual wavelength pyrometer 24 can be used to calibrate the temperature measurements by the thermal imaging camera 22. It has been found that thermal imaging camera 22 can become obscured by materials in the furnace 10. The control unit 12 can compare the temperature determined by the dual wavelength pyrometer 24 for a specific position and the temperature for the same position as determined by the thermal imaging camera 22. The control unit 12 can then apply a calibration factor to all measurements of the thermal imaging camera 22 to correct for any adverse obscuration effects.

In other embodiments a single wavelength pyrometer may be used. In order to be effective the single wavelength pyrometer would need to be mounted separately from the thermal imaging camera 22 in a position where obscuration is unlikely to occur. In yet another embodiment the thermal imaging camera itself may be capable of detecting radiation in two thermal wavelengths; this may permit the thermal imaging camera 22 to self-calibrate in order to diminish or remove the negative effects of obscuration.

A thermal image is compiled from of an array of measurements of infrared radiation collected by the individual pixels of the detector. The temperature of each pixel is determined from the collected radiation by application of Planck's Law which defines blackbody radiation as a function of wavelength and temperature. For most real objects, the emission is less efficient than that of a blackbody, and the emitted radiation is scaled down by a factor known as the surface emissivity. For accurate temperature measurements, surface emissivity must be known or calculated within the thermal imaging camera 22 or control unit 12.

Figure 3:
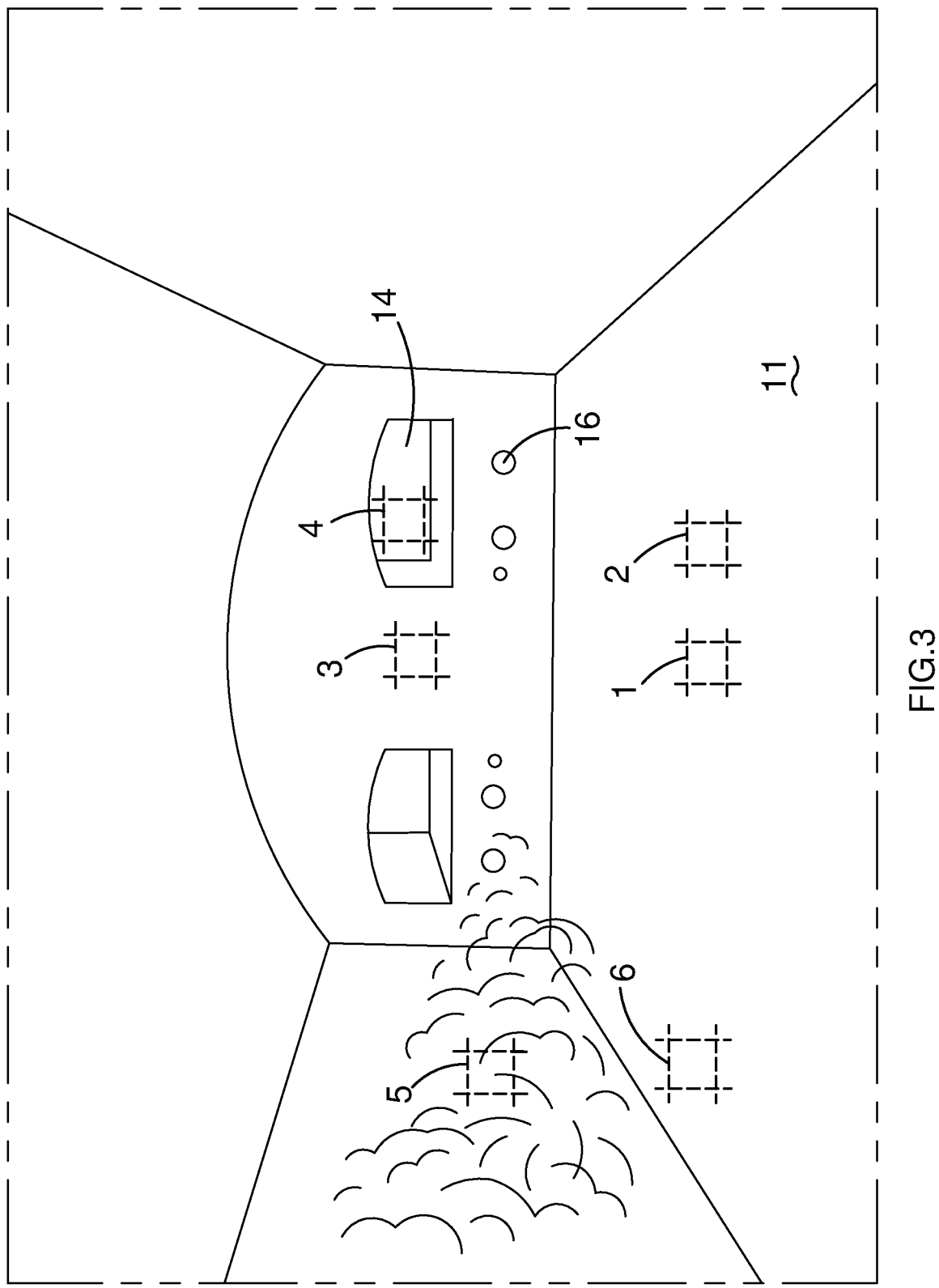
FIG. 3 is an example of an image of an end-fired furnace generated by a thermal imaging camera for use in an embodiment of the present invention.

The control unit 12 includes a reflection compensation module 26 that can identify and subtract a reflected component in the radiation received from the product on the base of the furnace 10. FIG. 3 is an example of an end-fired furnace image produced by the thermal imaging camera 22 showing the inside of the furnace 10. In this example the furnace is end-fired and burners 16 are positioned below the ports providing preheated air and exhaust. Molten glass 11 is provided on the base of the furnace 10.

The thermal imaging camera 22 receives thermal radiation from a first area 1 and a second area 2 on the surface of the molten glass 11. In addition, the thermal imaging camera 22 receives thermal radiation from a third area 3 on an end wall of the furnace 10 and a fourth area 4 in the target wall of the exhaust side regenerator. The geometry of the furnace 10 is such that radiation from the third area 3 is received at the thermal imaging camera 22 both directly and indirectly by way of reflection. Radiation from the third area 3 is reflected in the first area 1 and then received at the thermal imaging camera 22. Thus, the radiation received at the thermal imaging camera 22 from the first area 1 includes a radiated component from the molten glass 11 and a reflected component that is originally from the third area 3. Likewise, the radiation received at the thermal imaging camera 22 from the second area 2 includes a radiated component from the molten glass 11 and a reflected component that is originally from the fourth area 4. The relative proportions of the reflected and radiated components can be determined based on the emissivity $\varepsilon_g$ and reflectivity $r_g$ of the glass.

The first and second areas 1, 2 are at the same point along the length of the furnace 10 and are sufficiently close that their temperature $T_g$ and emissivity $\varepsilon_g$ are practically identical. A pixel viewing a spot within the first area 1 would receive radiation $R_1$ where $$R_1 = \varepsilon_g \cdot f(T_g) + (1-\varepsilon_g) \cdot f(T_3) \quad (1)$$

where the function $f(T)$ is based on the application of Planck's law to model the radiation from a surface at temperature T, but also includes instrument specific parameters which limit the amount of that radiation which is collected by that pixel of the thermal imaging camera 22. It is generally applied as a look-up table within the camera 22 rather than an equation.

A pixel viewing a spot within the second area 2 would receive radiation $R_2$ where $$R_2 = \varepsilon_g \cdot f(T_g) + (1-\varepsilon_g) \cdot f(T_4) \quad (2)$$

Thus, the emissivity of the glass can be calculated by the reflection compensation module 26 by subtracting equation (2) from (1) and rearranging to give:

$$\varepsilon_g = 1 - \frac{R_1 - R_2}{f(T_3) - f(T_4)} \quad (3)$$

$T_3$ and $T_4$ are known, from direct measurements of the third and fourth areas 3, 4. The third and fourth areas 3, 4 are specifically selected as areas that are unlikely to have the same temperature. In this example the temperature of the batch charger 14 in the fourth area 4 is likely to be less than the temperature of the third area 3 on an end wall of the furnace.

The emissivity of the glass can be calculated according to equation (3). The true glass temperature can then be derived by the reflection compensation module 26 in the control unit 12 by substituting the glass emissivity back into the equations (1) or (2).

The image from the thermal imaging camera 22 includes a fifth area 5 which is within a flame generated by a burner 16 and a sixth area 6 which is on a surface of the molten glass, close to the burner 16. The flame itself could be used as the hot area reflected in the glass together with a cooler area of wall reflected in the glass to work out the emissivity and temperature of the glass by the method explained above, instead of using a hotter and cooler area of wall.

Calculation of temperature using the calculated emissivity value for multiple points on the glass allows a one-dimensional temperature profile or a two-dimensional thermal map to be derived. Convective currents on the glass surface can be identified as paths from areas of high to areas of low temperature. These can in turn be used to predict batch flow as described below.

The bubbling point can be detected by the control unit 12 as a hotspot in either the temperature profile along the refractory walls or ceiling, or (by using the glass emissivity value) along the length of the glass. If temperature measurements are made by the thermal imaging camera 22 at the bubbling point on the glass surface, these will be of glass that has recently risen due to the convective currents within the glass, and therefore indicate the temperature of the glass at the bottom of the furnace 10.

The control signals can be implemented in the furnace 10 by adjusting fuel distribution and optionally flame length from the burners 16, 18, flame timing and/or the fuel/oxygen mixture. The flames from individual burners can also be controlled to change temperature at different positions in the furnace 10. Flame temperatures in the furnace 10 can be controlled in this way in order to reduce $NO_x$ emissions and control thermally dependent chemical reactions, as described below. Furthermore, the control signals may be used to control the reversal of burners 16, 18 according to the actual state of the furnace 10 as measured by the thermal imaging camera 22. Reversal of the burners 16, 18 may be undertaken when the temperature at a predetermined position in the furnace 10 reaches a predetermined value, or a maximum value.

The control unit 12 may be used to determine issues in the furnace 10 which may require attention or maintenance. For example, the thermal imaging camera 22 may detect areas of over-heating where there is risk of refractory damage. Equally the thermal imaging camera 22 may detect a position in the image which is consistently colder than expected; this may be indicative of a flaw in the wall of the furnace 10 at this point, which may require changes to the operating conditions, generation of an alarm and/or maintenance.

The thermal imaging camera 22 may be used during initial heating of the furnace 10. During heating it is important to ensure that different regions of the furnace 10 heat at the same rate. Otherwise it is possible that thermal stresses could cause damage. The control unit 12 is operable to compare real-time heating of the furnace 10 with an ideal heatmap in order to generate control signals for the burners 16, 18 that optimise operation.

The thermal imaging camera 22 may be installed before the furnace has been initially brought up to its operating temperature. In some cases a special lower temperature range thermal imaging camera may be installed that is capable of measuring the temperature from ambient conditions. For instance this might be an Arc Imager commercially available from Land Instruments Ltd. The temperature range of the low temperature camera may be between 0 to 500° C., or between 100° C. to 1000° C. This low temperature camera may be removed when the temperature of the furnace reaches its higher temperature range. The temperature range of the thermal imaging camera used in the furnace during operation may have a higher operating temperature regime dependent on process temperatures. For glass melting furnaces, and other flame-heated furnaces, temperature regimes of up to at least 1600° C. or more preferably up to at least 1800° C. are desirable.

The control unit 12 may determine when the temperature at one or more positions on the wall or crown of the furnace is below the condensation point of volatile compounds such as sodium hydroxide NaOH present in the furnace atmosphere. Ensuring the temperature does not go below this volatile condensation point can help prevent refractory damage.

The control unit 12 may also be used to identify regions required for ceramic welding repair and to subsequently confirm completion and/or integrity of the repair. Advantageously, the thermal image can be used during the welding process, where an optical image might be obscured by the atmosphere in these conditions.

The control system 12 may be used to determine when the quality of the glass has been compromised. For instance, the melting temperature may be too high or too cold for ideal glass formation. The thermal profile may have moved or the batch line exceeded a critical point. An alarm may be triggered to indicate that the quality of the product may have been compromised. Advantageously, this enables inspection equipment, or operators to be mobilised to solve the issues, and/or enables the operating conditions to be automatically adjusted. This may also lead to the particular product being quarantined for additional inspection.

The control unit 12 may be used to indicate reaction rate of thermally sensitive chemical reactions. The control unit 12 can identify positions where temperature is above a predetermined threshold temperature. It can further calculate the number or proportion of such positions within one or more regions within the image or within the whole image. If the predetermined threshold value is the temperature above which a chemical reaction occurs, then the number or proportion of positions above this temperature indicates the potential reaction volume. Using knowledge of the reaction and reagent concentrations, or from previous calibration, a likely production rate for the products from the chemical reaction can be calculated. The control unit 12 can also perform a more detailed analysis, wherein the temperature of each position and varying reaction rates at different temperatures are taken into account. In this case, an initial threshold value may not be required, or may be used just to reduce the number of pixels involved in the calculation.

Thermally dependent reaction rates could be estimated within a temperature band, or beneath a temperature threshold, for example in the case where reagent concentration may be depleted by higher temperature reactions. In some embodiments, the reaction rate would be used to indicate the production rate of desirable products from a chemical reaction. In other embodiments, the reaction rate would be used to indicate the production rate of unwanted by-products, such as $NO_x$. In this case the threshold temperature would be at least 1600° C. The control unit 12 also comprises a batch identification module 28. The batch identification module 28 is configured to identify solid regions of batch on the surface of the molten product 11. Solid batch is at a lower temperature than the molten product 11, and therefore the control unit can discount these regions when generating control signals for the furnace 10.

The batch identification module is configured to check that melting of the batch is occurring within acceptable conditions. For instance, if solid batch is identified at unwanted positions within the furnace, furnace control signals may be generated and alarms may be triggered.

The batch identification module 28 is also configured to track movement of batch, calculate its speed, direction of movement and acceleration based on change of position since previous images, and predict future movement. Future movement prediction uses the current movement parameter of the batch and the convective currents within the glass and the furnace calculated as described above. Current and planned furnace settings can also be factored into the calculation. If predicted movement indicates batch movement beyond the required limits, or sub-optimal melting or mixing, control signals may be generated to adjust the temperature profile and thereby the convection currents and batch melting in the furnace.

In some embodiments the control unit 12 may be configured to correct for the perspective view of the thermal imaging camera 22 so that the distance, speed, acceleration, size, volume, thermal profiles and maps calculated as described above are in real world rather than image coordinates. In this case knowledge of the mounting position and shape of the furnace is required.

The invention claimed is:

1. A control system for a furnace, comprising:
a thermal imaging camera configured to:
receive thermal radiation from a plurality of positions in the furnace; and
generate an image which includes temperature information for the plurality of positions in the furnace; and
a control unit configured to:
receive the image from the thermal imaging camera; and
generate control signals for the furnace based on the image;
wherein the control unit comprises a reflection compensation module configured to:
identify and subtract a reflected component in the thermal radiation; and
select two positions associated with a product in the furnace, wherein the two positions are associated with substantially the same temperature, wherein a first reflected component corresponding to a first position of the two positions is associated with a first temperature, and wherein a second reflected component corresponding to a second position of the two positions is associated with a second temperature different than the first temperature.

2. The control system of claim 1, wherein the control signals are configured to adjust a temperature in the furnace.

3. The control system of claim 1, wherein the control signals are configured to differentially adjust a temperature at one or more positions of the plurality of positions in the furnace.

4. The control system of claim 1, wherein the control signals are configured to adjust batch introduction.

5. The control system of claim 1, wherein the control unit is further configured to compare the image to a previously collected image to detect a change in a temperature or a position.

6. The control system of claim 1, wherein the reflection compensation module is further configured to calculate an emissivity of the product.

7. The control system of claim 6, wherein the reflection compensation module is further configured to calculate, based on the emissivity of the product, a temperature of the product.

8. The control system of claim 1, further comprising:
an additional temperature sensing device configured to receive radiation from a single position in the furnace and to determine a temperature for that position,
wherein the control unit is further configured to:
compare a first temperature for the single position measured by the additional temperature sensing device and a second temperature for the single position measured by the thermal imaging camera; and
calibrate the temperature information associated with the image generated by the thermal imaging camera.

9. The control system of claim 8, wherein the additional temperature sensing device is further configured to:
receive radiation at two or more wavelengths; and
determine a temperature for the single position based on an amount of the radiation received at the two or more wavelengths.

10. The control system of claim 1, wherein the control unit comprises a batch identification module configured to identify batch in the image.

11. The control system of claim 10, wherein the batch identification module is further configured to:
determine a speed of the batch; or
track a movement of the batch.

12. The control system of claim 11, wherein tracking the movement of the batch comprises predicting the movement of the batch.

13. The control system of claim 12, wherein predicting the movement of the batch comprises predicting the movement of the batch based on temperature information at a plurality of positions.

14. The control system of claim 10, wherein the control signals are configured to adjust a temperature at one or more positions in the furnace to control a movement of the batch.

15. The control system of claim 10, wherein the control signals are configured to control introduction of the batch.

16. The control system of claim 10, wherein the control unit is further configured to:
identify anomalous batch temperatures or locations; and
generate second control signals configured to highlight quality issues with the batch.

17. The control system of claim 16, wherein the control signals are configured to:
change a temperature profile in the furnace; or
alert operators to prevent or mitigate damage associated with one or more of:
operation of the furnace,
furnace heat up, or
maintenance activities.

18. The control system of claim 1, wherein the control unit is further configured to:
identify anomalous temperatures and temperature differentials in the furnace, wherein the anomalous temperatures and temperature differentials are indicative of one or more of: thermal stresses, damage, or an increased likelihood of damage.

19. The control system of claim 1, wherein the control unit is further configured to:
identify one or more positions in the furnace where a temperature reaches a predetermined value, wherein the predetermined value corresponds to a potential for a thermally dependent chemical reaction.

20. The control system of claim 19, wherein the control unit is further configured to:
predict, based on a number of positions where the temperature exceeds the predetermined value, a production rate of the thermally dependent chemical reaction.

21. The control system of claim 20, wherein predicting the production rate is further based on the temperature of the positions and knowledge of a reaction rate as a function of temperature.

22. The control system of claim 19, wherein the thermally dependent chemical reaction is associated with a formation of an unwanted by-product.

23. The control system of claim 19, wherein the thermally dependent chemical reaction is associated with production of NOR, and wherein the predetermined value is at least 1600° C.

24. The control system of claim 19, wherein generating the control signals is based on determining one or more second positions where a temperature exceeds the predetermined value, wherein the control signals are configured to adjust the temperature in the furnace.

25. A furnace for receiving and melting batch to form a product, the furnace comprising:
a chamber;
a batch dispenser for introducing batch to the chamber;
at least one burner for melting the batch introduced to the chamber; and
a control system comprising:
a thermal imaging camera configured to:
receive thermal radiation from a plurality of positions in the furnace; and
generate an image which includes temperature information for the plurality of positions in the furnace; and
a control unit configured to:
receive the image from the thermal imaging camera; and
generate, based on the image, control signals for the furnace;
wherein the control unit comprises a reflection compensation module configured to:
identify and subtract a reflected component in the thermal radiation, and
select two positions associated with a product in the furnace, wherein the two positions are associated with substantially the same temperature wherein a first reflected component corresponding to a first position of the two positions is associated with a first temperature and wherein a second reflected component corresponding to a second position of the two positions is associated with a second temperature different than the first temperature.

26. The furnace of claim 25, further comprising:
one or more first burners on a first side of the chamber; and
one or more second burners on a second side of the chamber, wherein the control signals are configured to switch, based on the image, between the one or more first burners and the one or more second burners.

27. The furnace of claim 26, wherein the control signals are configured to switch between the one or more first burners and the one or more second burners when a temperature at one or more predetermined positions reaches a predetermined value.

28. The furnace of claim 26, wherein the control signals are configured to control fuel and oxygen delivered to the one or more first burners and the one or more second burners when a temperature at one or more predetermined positions reaches a predetermined value.

29. The furnace of claim 28, wherein the predetermined value is chosen to optimize product quality, to optimize energy efficiency, or to avoid damage to furnace infrastructure.

30. A method of controlling a furnace, the method comprising the steps of:
receiving, via a thermal imaging camera, thermal radiation corresponding to a plurality of positions in the furnace;
generating an image which includes temperature information associated with the plurality of positions in the furnace;
generating, by a control unit and based on the image, control signals for the furnace;
identifying, using a reflection compensation module of the control unit, a reflected component in the thermal radiation;
subtracting, using the reflection corn sensation module, the reflected component in the thermal radiation; and
selecting two positions associated with a product in the furnace wherein the two positions are associated with substantially the same temperature, wherein a first reflected component corresponding to a first position of the two positions is associated with a first temperature, and wherein a second reflected component corresponding to a second position of the two positions is associated with a second temperature different than the first temperature.

31. A computer program product comprising computer executable instructions which, when executed by a computer, cause the computer to carry out steps including:
receiving thermal radiation at a thermal imaging camera from a plurality of positions in a furnace;
generating an image which includes temperature information for the plurality of positions in the furnace;
generating control signals for the furnace at a control unit using the image;
identifying, using a reflection compensation module of the control unit a reflected component in the thermal radiation;
subtracting, using the reflection compensation module, the reflected component in the thermal radiation; and
selecting two positions associated with a product in the furnace, wherein the two positions are associated with substantially the same temperature, wherein a first reflected component corresponding to a first position of the two positions is associated with a first temperature, and wherein a second reflected component corresponding to a second position of the two positions is associated with a second temperature different than the first temperature.

32. The computer program product of claim 31 further comprising:
recording images at predetermined intervals in time or associated with predetermined events comparing images taken over an extended timescale to identify maintenance requirements.

* * * * *

UNITED STATES PATENT AND TRADEMARK OFFICE
CERTIFICATE OF CORRECTION

PATENT NO. : 11,312,648 B2
APPLICATION NO. : 16/467533
DATED : April 26, 2022
INVENTOR(S) : Turner et al.

It is certified that error appears in the above-identified patent and that said Letters Patent is hereby corrected as shown below:

In the Claims

Column 14, Line 36:
In Claim 23, delete "NOR," and insert --$NO_x$,-- therefor

Column 14, Line 64:
In Claim 25, delete "radiation," and insert --radiation;-- therefor Column 14, Line 67:
In Claim 25, after "temperature", insert --,--

Column 15, Line 3:
In Claim 25, after "temperature", insert --,--

Column 16, Line 1:
In Claim 30, delete "corn sensation" and insert --compensation-- therefor Column 16, Line 4:
In Claim 30, after "furnace", insert --,--

Column 16, Line 22:
In Claim 31, after "unit", insert --,--

Signed and Sealed this
Twentieth Day of December, 2022

Katherine Kelly Vidal
*Director of the United States Patent and Trademark Office*